United States Patent [19]

Lemonon et al.

[11] 4,346,505
[45] Aug. 31, 1982

[54] METHOD OF FABRICATING PIEZOELECTRIC TRANSDUCER WITH POLYMER ELEMENT

[75] Inventors: Claire Lemonon; François Micheron, both of Paris, France

[73] Assignee: Thomson-CSF, Paris, France

[21] Appl. No.: 108,706

[22] Filed: Dec. 31, 1979

[30] Foreign Application Priority Data

Jan. 4, 1979 [FR] France .................. 79 00200

[51] Int. Cl.³ .................................. H01L 41/22
[52] U.S. Cl. .................... 29/25.35; 264/22; 361/233
[58] Field of Search .............. 29/592 E, 25.35; 427/100; 361/233; 264/22

[56] References Cited

U.S. PATENT DOCUMENTS

3,924,324 12/1975 Kodera .................. 361/233 X
4,127,681 11/1978 Ferren et al. .............. 427/100

Primary Examiner—Carl E. Hall
Attorney, Agent, or Firm—Cushman, Darby & Cushman

[57] ABSTRACT

A piezoelectric transducer having at least one active element consisting of a film of polymer material is disclosed. Electrodes are formed on the two principal faces of the film after polarization of the film. The film is endowed with piezoelectric properties under the sole action of an electric field oriented along the normal to its principal faces and without any need for preliminary stretching. The anisotropy induced as a result of this orientation is solely electrical.

8 Claims, 12 Drawing Figures

METHOD OF FABRICATING PIEZOELECTRIC TRANSDUCER WITH POLYMER ELEMENT

BACKGROUND OF THE INVENTION

This invention relates to piezoelectric transducers and may be extended to pyroelectric transducers as well, the active element of which is constituted by a polymer in sheet form. When subjected to a suitable treatment, said active element exhibits piezoelectric and pyroelectric properties which are similar to those possessed by certain classes of crystals.

One of the first synthetic polymers to show clear evidence of piezoelectric and pyroelectric properties was polyvinylidene fluoride. In this case the treatment includes: (a) unidirectional drawing of a flat film of said polymer, (b) metallizing the faces of the drawn film and (c) subjecting the metallized faces to an electric field by connecting its metallized faces to an electric polarizing generator. The disadvantage of a flat film lies in the fact that its use is limited to transducers having developable shapes, that is shapes which are capable of being opened and flattened out upon a plane without stretching any element. Furthermore, the thinness of the films employed entails the need for stretching latter by means of a prestressing device.

This disadvantage can be overcome by means of a thermoforming technique which makes it possible to obtain a non-developable self-supporting shape which consequently does not have any joint. The thermoforming operation is carried out at a temperature which results in stretching of the molecular chains since this stretching process is intended to produce a change of phase which makes the material polar. It is then an easy matter to induce electrical anisotropy by polarization. The electrodes are clearly formed after the polymer film has been given its final shape.

The technique which includes inducing the polar phase by substantial drawing of the polymer makes it necessary to take precautions in order to prevent shrinkage of the drawn film or to prevent the shape obtained by thermoforming from shrivelling-up and thus losing its self-supporting properties. During operation, a polymer-film transducer must be capable of withstanding a temperature rise while retaining its shape, its dimensions and its conversion efficiency.

In addition to the lack of dimensional stability resulting from the disturbing effect produced on the mechanical equilibrium by drawing performed above the melting temperature of the polymer, it should also be mentioned that the shapes usually obtained from polyvinylidene fluoride have relatively low mechanical compliance.

In order to overcome these drawbacks, the invention provides a method of manufacture which essentially includes electrically polarizing a shaped product so as to retain its original elastic properties. This does not prevent development of piezoelectric and pryroelectric properties since the electrical anisotropy induced by the polarization is the only factor involved in the transducing action which takes place. By reason of the fact that only the desired anisotropy is electrical and that it is produced by an electric field having a direction perpendicular to the faces of the polymer film, the transducing action is related to the effect of certain crystal systems which have symmetry of revolution with respect to the normal to the faces of the manufactured product.

BRIEF DESCRIPTION OF THE INVENTION

The present invention relates to a piezoelectric transducer in which the active element comprises a film of polymer material provided on its two principal faces with electrodes forming a capacitor. The transducer is distinguished by the fact that the anisotropy induced in said material is solely electrical and results from a dipolar orientation in the direction of the normal to said principal faces.

The invention is also directed to the method of manufacture of the transducer element as mentioned in the foregoing.

BRIEF DESCRIPTION OF THE DRAWINGS

A more complete understanding of the invention will be gained from the following description and from the accompanying drawings in which.

DESCRIPTION OF THE PREFERRED EMBODIMENTS

Figure 1A:
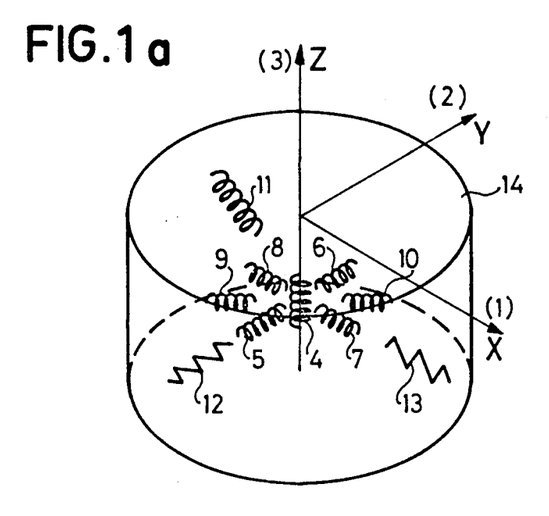
FIGS. 1 and 2 are explanatory diagrams.
Figure 1B:
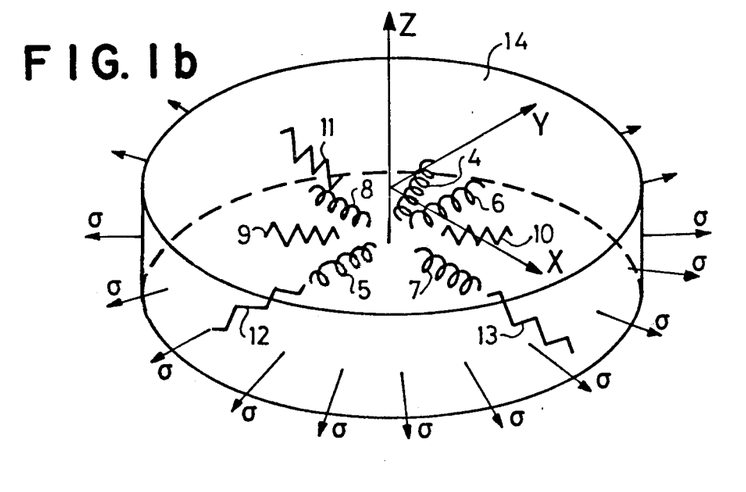
Figure 2A:
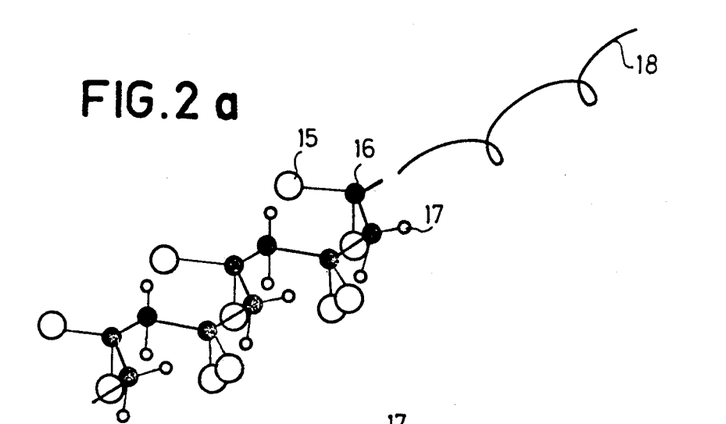
Figures 2B, 2C:
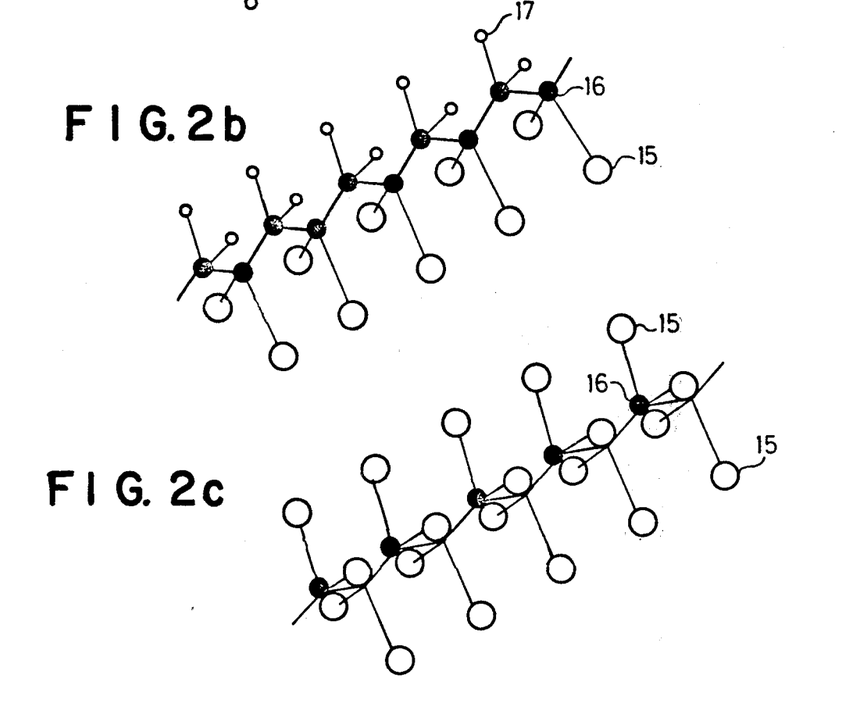

In FIG. 1, there can be seen a cylindrical element 14 made from a polymer material such as polyvinylidene fluoride ($PVF_2$). The structure of $PVF_2$ is composed of spheroidal crystal masses in an amorphous phase. The macroscopic mechanical properties are those of an isotropic substance. This polymer has three distinct crystalline forms $\alpha$, $\beta$ and $\gamma$. The $\alpha$ form is the one obtained from the molten polymer. The molecular chains are wound in a helix 18 as shown at (a) in FIG. 2. It is observed that the $\alpha$ form has an arrangement of carbon atoms 16, hydrogen atoms 17 and fluorine atoms 15 such that the electric dipole moments compensate for each other along the chain. The $\beta$ form corresponds to a molecular chain as shown at (b) in FIG. 2. This $\beta$ form and the $\gamma$ form which is similar to this latter are less stable than the $\alpha$ form; they are characterized by a zigzag chain and by electric dipole moments in which the effects are added.

The structure of the element 14 of FIG. 1 can therefore be designated schematically by a system of chains 4, 5, 6, 7, 8, 9, 10, 11 which represent at (a) a non-polar solid phase II ($\alpha$ phase) and by a few chains 12 and 13 which represent a highly polar solid phase I ($\beta$ and $\gamma$ phases). At (a), the polymer material has not been subjected to any stress after solidification so that, with respect to the system of axes XYZ, no direction of molecular chain has undergone any change with respect to the original arrangement. The element 14 shown at (a) in FIG. 1 is endowed with good mechanical stability and can be considered as electrically isotropic from a macroscopic standpoint since it has not been electrically polarized.

In order to establish piezoelectric and pyroelectric properties in polyvinylidene fluoride, it is a known practice to subject the element 14 to substantial drawing which is intended to convert the non-polar phase II to a polar phase I. This mechanical action is illustrated at (b) in FIG. 1 in which it is observed that the element 14 is drawn uniformly in the plane XY in circumferential tension $\sigma$. The diameter of the element 14 has increased and its thickness has decreased.

One of the consequences of this drawing process, which is performed below the melting point of the polymer, is that the chains 5 to 13 have moved back to the direction of the plane XY, with the result that there exists at (b) a mechanical anisotropy which the element 14 did not possess at (a). Moreover, the initially spheroidal masses have assumed a lenticular shape within the amorphous phase. The other consequence is that certain non-polar chains 9, 10, 11 have become polar, which is readily apparent when comparing the structures (a) and (b) of FIG. 2.

In order to produce the electrical anisotropy which is necessary for the appearance of piezoelectric and pyroelectric effects, another known practice consists in subjecting the drawn element 14 shown at (b) in FIG. 1 to an electric field having a direction Z. To this end, the principal circular faces of the element 14 shown at (b) are coated with electrodes between which a direct-current high voltage is applied. When treated in this manner, the element 14 shown at (b) together with its electrodes forms a transducer element which produces a proportional electric voltage when heated or subjected to an external stress. Conversely, an electric voltage applied between its electrodes produces proportional mechanical deformations along the axis Z and in the plane XY.

It is apparent from the foregoing that, in order to facilitate electrical polarization, this latter has been made dependent on a preliminary treatment which alters the mechanical isotropy of the polymer. This results in a lack of dimensional stability which entails the need to take precautions in order to prevent modification of the shape given to the transducer.

Figure 3:
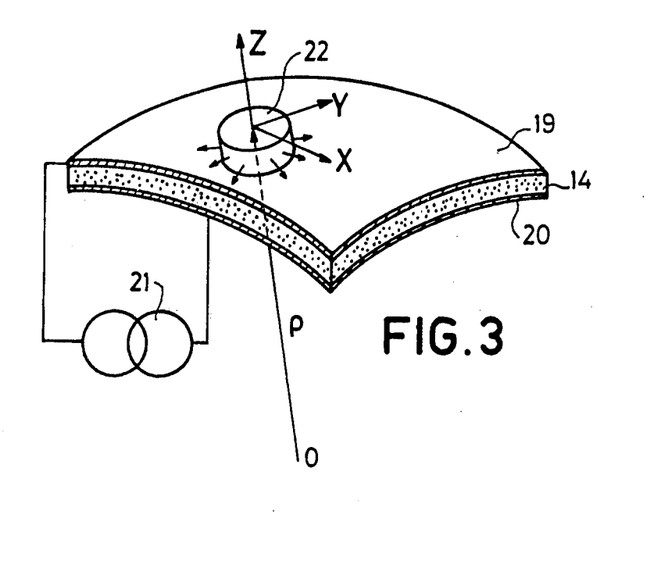
FIG. 3 illustrates a fragment of a transducer element according to the invention.

In fact, the operation of a piezoelectric transducer of polymer material can be analyzed in simplified manner by adopting the general form of a transducer illustrated in FIG. 3 as a model. This non-developable form comprises a sheet 14 of polyvinylidene fluoride provided with electrodes 19 and 20. An electric generator 21 connected to the electrodes 19 and 20 induces a variation of polarization $\delta P$ to which there correspond, in the case of the element 22 having a radius of curvature $\rho$ a deformation $\delta Z$ in thickness and associated transverse deformations; the Poisson coefficient $\nu$ of the material relates these deformations as illustrated by arrows to the direct deformation $\delta Z$. During fabrication, an electrical polarization P has been established in the polymer material and is expressed by the relation:

$$P = N \cdot \mu \cdot <\cos\theta> \qquad (1)$$

where N represents the volume concentration of the dipoles carried by the molecular chains, $\mu$ represents the dipole moment, $<\cos\theta>$ is a contribution factor which depends on the inclination $\theta$ of the dipole moment with respect to the axis Z.

The piezoelectric effect which is characteristic of the thickness mode can be represented by a coefficient $d = \delta P/\delta Z$. Since $\mu$ and $<\cos\theta>$ are constants, we have:

$$d = \mu \cdot <\cos\theta> \cdot \delta N/\delta Z \qquad (2)$$

which may be written in the form:

$$d = -\mu \cdot <\cos\theta> / v^2 \cdot dv/dZ \cdot n \qquad (3)$$

where n represents the number of dipoles which take part in the polarization, v represents the volume of the element 22.

Relation (3) may be written:

$$d = -P \cdot 1/v \, dv/dZ \qquad (4)$$

and observing that the volume compliance $s_v$ is precisely equal to $1/v \cdot dv/dZ$, the following simple result is obtained:

$$d = -P \cdot s_v \qquad (5)$$

with, by definition:

$$s_v = \frac{3(1-2\nu)}{E}$$

where E is the Young number of the polymer material.

In regard to the pyroelectric effect, one may proceed in a similar manner by defining a coefficient $$p = dP/dT$$

where T is the temperature.

We then obtain the simple relation:

$$p = P \cdot \alpha_v \qquad (6)$$

where $\alpha_v$ is the coefficient of volume thermal expansion.

Relations (5) and (6) reflect in a summary but correct manner the piezoelectric and pyroelectric effects of polymer materials which have been subjected to electrical polarization P.

A much more significant formulation is offered by the tensorial representation in conjunction with the notations employed in crystallography. By adopting the indices 1, 2 and 3 mentioned at (a) in FIG. 1, the method of fabrication by unidirectional drawing followed by polarization in polar phase results in a piezoelectric effect described by means of the tensor $d_{ijk}$ of rank three as follows:

$$d_{ijk} = \begin{vmatrix} 0 & 0 & 0 & 0 & d_{15} & 0 \\ 0 & 0 & 0 & d_{24} & 0 & 0 \\ d_{31} & d_{32} & d_{33} & 0 & 0 & 0 \end{vmatrix} \qquad (7)$$

The variation of polarization $dP_i$ (vector) is related to the deformation $dX_{jk}$ (tensor of rank two) by the tensorial relation:

$$dP_i = d_{ijk} \cdot dX_{jk}$$

The pyroelectric effect is defined by the following tensorial formula:

$$dP_i = p_i dT$$

with dT temperature variation (scalar)

$$\text{and } p_i = \begin{vmatrix} 0 \\ 0 \\ p_3 \end{vmatrix} \tag{8}$$

A study of relations (7) and (8) shows that polyvinylidene fluoride (PVF$_2$) which is drawn and subsequently polarized in accordance with the teachings of the present state of the technique is to be considered as falling into class 2 mm, which means that it behaves as a pyramidal orthorhombic crystal. The compliance tensor of order four of this class comprises nine differentiated coefficients. The mechanical equilibrium is highly disturbed and this explains the fact that the product obtained has a tendency to shrink or to shrivel-up.

In order to have the advantage of favorable piezoelectric and pyroelectric properties without being exposed to the same drawbacks, the invention proposes to induce piezoelectric properties such that the coefficients $d_{31}$ and $d_{32}$ are equal as well as the coefficients $d_{24}$ and $d_{15}$.

The piezoelectric effect obtained is therefore described by the tensor:

$$d_{ijk} = \begin{vmatrix} 0 & 0 & 0 & 0 & d_{24} & 0 \\ 0 & 0 & 0 & d_{24} & 0 & 0 \\ d_{31} & d_{31} & d_{33} & 0 & 0 & 0 \end{vmatrix} \tag{9}$$

The compliance tensor is:

$$s = \begin{vmatrix} s_{11} & s_{12} & s_{12} & 0 & 0 & 0 \\ s_{12} & s_{11} & s_{12} & 0 & 0 & 0 \\ s_{12} & s_{12} & s_{11} & 0 & 0 & 0 \\ 0 & 0 & 0 & 2(s_{11}\,s_{12}) & 0 & 0 \\ 0 & 0 & 0 & 0 & 2(s_{11} - s_{12}) & 0 \\ 0 & 0 & 0 & 0 & 0 & 2(s_{11} - s_{12}) \end{vmatrix}$$

In fact, the polymer material has macroscopic mechanical properties which are those of an isotropic substance.

However, an intermediate degree of anisotropy can also remain at the level of the crystalline masses. This corresponds to the isomorphism which characterizes transverse isotropy and the crystallographic classes 4 mm (pyramidal ditetragonal) and 6 mm (pyramidal dihexagonal). The two classes last named are advantageous when it is desired to obtain a pyroelectric transducer since the tensor $P_i$ is again of the form:

$$P_i = \begin{vmatrix} 0 \\ 0 \\ p_3 \end{vmatrix}$$

It is useful to recall that all pyroelectric transducers are also piezoelectric transducers but the converse does not hold true.

Figure 4A:
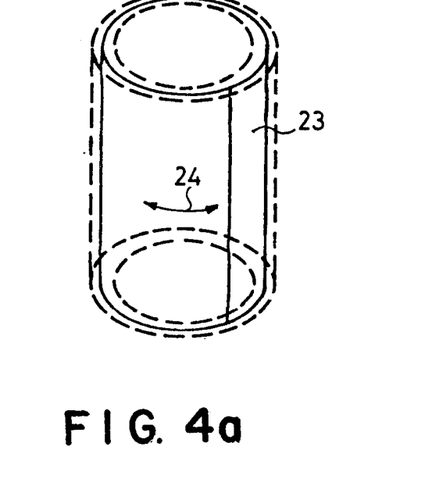
FIG. 4 is an explanatory diagram.
Figure 4B:
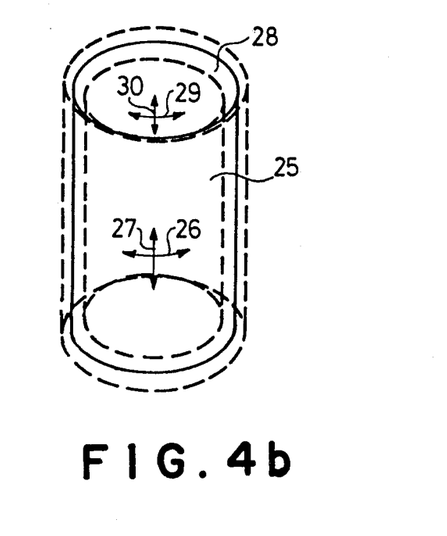

FIG. 4 illustrates the difference in operation of a piezoelectric transducer of cylindrical shape, depending on whether it is fabricated from a film of polymer material which has been subjected to a drawing operation or whether, on the contrary, the anisotropy induced is purely electrical. The transducer shown at (a) in FIG. 4 is fabricated from a flat film which has been drawn in the direction 24. This film is stretched over an elastic core 23 of cylindrical shape and thus assumes the shape shown in full lines when at rest. By applying an alternating-current voltage to the electrodes which cover the two principal faces of the film which is wound on the periphery of the core 23, an alternate radial expansion of the transducer is accordingly observed. Its cylindrical radiation surface vibrates between the shapes shown in dashed lines. It is observed that the volume displaced by the transducer is primarily due to the elongation which takes place in the direction 24.

The transducer shown at (b) in FIG. 4 is fabricated in accordance with the invention by molding of the polymer material in the hot state. The shaped element thus obtained is made piezoelectric solely under the action of an electrical dipole orientation along the normal to the molded film. Said shaped element has the appearance of a cylindrical box having an open bottom end, a cylindrical wall 25 and an end-wall 28 which are formed in a single piece. The interior of said shaped element is empty since it is self-supporting. The element 25, 28 shown at (b) in FIG. 4 is coated externally and internally with electrodes. When an alternating-current voltage is applied to the electrodes, said element begins to vibrate both radially and axially. The volume swept by this vibration is illustrated by the two contours shown in dashed lines. The expansion uniformly affects both the cylindrical wall 25 and the end-wall 28 of the transducer; the circumferential deformations 26 and 29 associated with the axial deformation 27 and with the radial deformation 30 produce a variation in volume of the transducer, thereby causing radiation over the entire surface of this latter. The comparison which has just been mentioned is intended to show that piezoelectric properties induced in a film of polymer material solely as a result of suitable electrical polarization can be utilized just as readily as those which had been obtained up to the present time and called for preliminary drawing of the film.

By reason of the fact that preliminary drawing of the polymer material has been dispensed with, the fabrication is appreciably simplified since it only comprises a shaping operation without drawing followed by an electrical polarization operation.

In the most simple case, it is possible to start from a solution of PVF$_2$ in a solvent such as dimethylformamide. By coating the surface of a mold with a layer of this solution and by evaporating the solvent at a temperature below 80° C., a film of PVF$_2$ in polar phase I is obtained. This film is then coated with electrodes on both faces. A high voltage is applied between the two electrodes in order to cause dipolar orientation in the direction of the normal to the faces. Since the PVF$_2$ is in the polar phase I, there is no need whatsoever for any drawing operation in order to ensure that electrical polarization is readily established. Another mode of operation consists in shaping the PVF$_2$ by means of a hot molding operation. When the PVF$_2$ solidifies from the molten state, the non-polar phase II is obtained. In this state of crystallization which corresponds to the crystallographic class 2/m, the material does not have a dipole moment $\mu$ (see the chain structure (a) of FIG. 2). However, it has been shown by experience that, on condition that an intense electric field of the order of 1 MV/cm or more is applied, there accordingly takes place a conversion from phase II to a polar phase which can be designated as a "pseudo I phase". This conversion takes place when electrical polarization of the molten polymer is carried out at room temperature or at a higher temperature. In order to produce a phase conversion, it is therefore possible to dispense with the drawing operation which had hitherto been considered necessary for electrical polarization of the molten $PVF_2$. The fact that piezoelectric properties can be induced in the molten $PVF_2$ solely under the action of a very intense electric field assumes considerable practical importance.

An improvement can be made in this technique by fabricating the shaped element from a copolymer which associates molecular chains of polytetrafluoroethylene (PTFE) with the molecular chains of $PVF_2$. In fact, this association in which the concentration of PTFE is within the range of a few % to approximately 30% gives rise to a polar phase having chains of the zigzagging type. This conversion can be understood by comparing the chains of $PVF_2$ with those of PTFE which are illustrated respectively at (a) and (c) in FIG. 2. The molecular chain of PTFE does not have an electric dipole moment since fluorine atoms 15 have been substituted for all the hydrogen atoms 17 of the molecular chain of the polyethylene. Nevertheless, the molecular chain of PTFE is of the zigzagging type and can be linked to $PVF_2$ chains. Linking has the effect of converting the helical chains of $PVF_2$ to zigzagging chains which are similar to that shown at (b) in FIG. 2. By solidification from the molten state, the $PVF_2$-PTFE copolymer finally has a polar phase which is electrically polarized more readily than if $PVF_2$ were the sole constituent. The use of the $PVF_2$-PTFE copolymer provides the advantage of substantially higher mechanical compliance than that obtained from $PVF_2$ alone. The advantage of PTFE as linking agent lies in the fact that it has high oxidation resistance.

Without departing from the field of the invention, other suitable copolymers may be mentioned. Starting from PVF or in other words polyvinyl fluoride, one of the copolymers PVF-PTFE and PVF-$PVF_2$ can be employed as a base material. Another copolymer which is suitable for use is chlorinated polyethylene, the three constituents of which are polyethylene PE, polyvinyl chloride PVC and polyvinylidene chloride $PVCl_2$. A polar material which is obtained from the molten state and is also worthy of mention is polychlorotrifluoroethylene $PVClF_3$.

In the case of materials which are polarizable in an electric field, PVC and PVF can be added to the $PVF_2$ already mentioned and are essentially amorphous, whether they are obtained from the molten state or by evaporation of solvents such as cyclohexanone or dimethylformamide.

The following table summarizes the properties of a few polymer and copolymer materials of interest for the preparation of piezoelectric elements.

Figure 6:
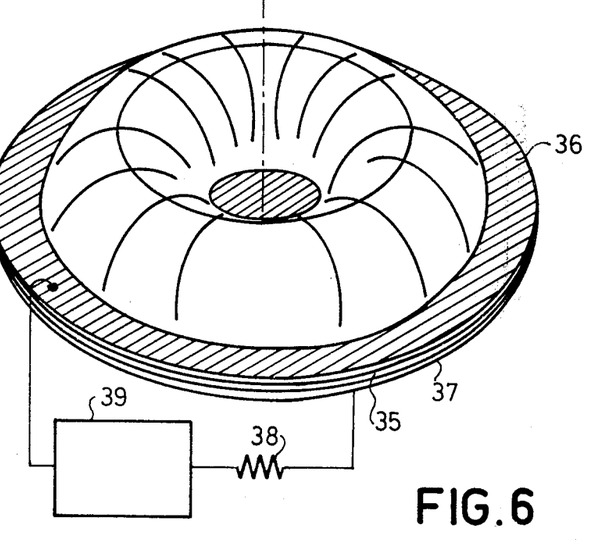
FIG. 6 is a view in isometric perspective showing a transducer according to the invention.

In order to gain a clearer idea, it is possible by way of example to contemplate the manufacture of a loudspeaker diaphragm as shown in FIG. 6 which is a view in isometric perspective. This diaphragm constitutes a complete electroacoustic transducer and comprises a sheet 35 of polymer to which a non-developable shape consisting of a bulge has been given. The shape of said bulge is obtained by making an equatorial cut in a toric surface. A flat annular flange forms the periphery of said bulge and its center is coplanar with the annular flange. In FIG. 6, the two principal faces of the diaphragm 35 are covered by electrodes 36 and 37 in order to form a capacitor.

Figure 5:
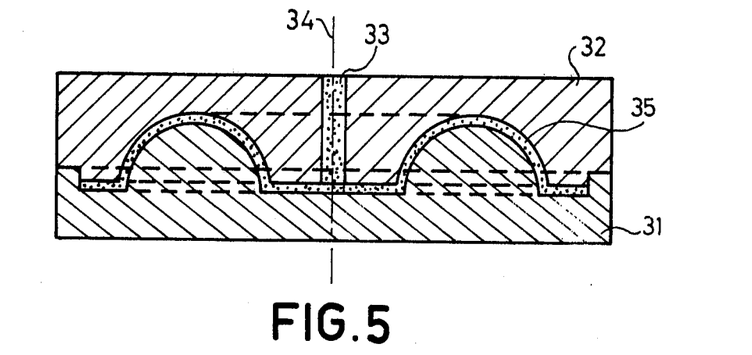
FIG. 5 is a sectional view of a molding device.

In order to construct a diaphragm having the shape illustrated in FIG. 6, one method which can be adopted by way of example consists in preparing a mold having two sections as shown in FIG. 5, which is a cross-sectional view taken in a meridian plane. Said mold is made up of two half-shells placed one above the other. The half-shell 31 is machined to form raised portions and the half-shell 32 is machined to form recessed portions so that, by fitting these two half-shells together, they delimit an internal space having the desired shape and thickness. An injection passage 33 communicates with said internal space. By way of example, the passage 33 is placed along the axis of revolution of the mold. By injecting molten polymer into the passage 33, the internal space can be completely filled and a molded diaphragm 35 can thus be obtained after solidification of the injected paste.

By way of alternative, the hollow half-shell 32 can be employed alone and molding can be carried out by application of a preform of polymer in paste form. By means of an operation which consists in blowing hot air, the preform is caused to line the hollowed-out portion of the half-shell 32 and solidifies in contact with the mold wall.

It is also possible to adopt the compression molding technique. The powdered polymer is placed within a half-shell 32 which is heated to a value above the solidification temperature. The half-shell 31 then compresses the molten powder under a pressure of the order of 50 to 100 kgs/$cm^2$. The casting thus formed is then cooled under pressure. If only one of the half-shells 32 or 31 is employed, the castings can be obtained by projection of polymer powder onto the half-shell which is heated to a temperature above the solidification point. This coating operation can also be carried out by dipping in a concentrated solution of polymer. The coated half-shell is heated to a slight extent and placed within a vacuum enclosure or an air circulation chamber in order to permit rapid evaporation of the solvent.

|  | Phase I $PVF_2$ | copolymer 96% $PVF_2$ 4% PTFE | copolymer 78% $PVF_2$ 22% PTFE | PVF | PVC | Unit |
|---|---|---|---|---|---|---|
| $s_y$ | $4 \times 10^{-9}$ | $7 \times 10^{-9}$ | $5 \times 10^{-9}$ | $10^{-10}$ | $10^{-10}$ | $N^{-1} \cdot m^2$ |
| p | $3$ to $6 \times 0\,10^{-2}$ | $2.2 \times 10^{-2}$ | $1.4 \times 10^{-2}$ | $1$ to $2 \times 10^{-2}$ | $5 \times 10^{-3}$ | $C \cdot m^{-2}$ |
| d | $10$ to $30 \times 10^{-12}$ | $7 \times 10^{-12}$ | $4 \times 10^{-12}$ | $1$ to $5 \times 10^{-12}$ | $1$ to $2 \times 10^{-12}$ | $C \cdot N^{-1}$ |
| $\alpha_y$ | $1.5 \times 10^{-4}$ | $1.5 \times 10^{-4}$ | $1.5 \times 10^{-4}$ | $2 \times 10^{-4}$ | $2 \times 10^{-4}$ | $K^{-1}$ |
| p | $1$ to $3 \times 10^{-5}$ | $1$ to $2 \times 10^{-5}$ | $1$ to $2 \times 10^{-5}$ | $1$ to $5 \times 10^{-6}$ | $1$ to $2 \times 10^{-6}$ | $C \cdot m^{-2} \cdot K^{-1}$ |

The values indicated in the table are mean values of the quantities defined in the foregoing. The relations $d = P.s_y$ and $p = P.\alpha_y$ lead only to values which are approximately equal to experimental values.

Shaping of polymer materials can be carried out by all the methods employed in the plastics industry.

The thermoforming technique also comes within the scope of the invention on condition that the operation is carried out with a preform, said preform being heated to a temperature which rises above the solidification point; the two portions of the mold are then at a temperature below the solidification point.

After completion of the molding operation, the diaphragm can be electrically polarized. To this end, said diaphragm must be coated with at least one conductive electrode. By way of example, a film of metal such as aluminum can be deposited in vacuo. It is also possible to adopt a non-electrolytic chemical deposition of metals such as copper, nickel and so forth. A silver paint can also be employed as a conductive coating. Finally, metallization can be obtained by means of the mold in the form of thin sheets pressed against the object during the molding stage.

In FIG. 6, there can be seen the polarization technique with two electrodes formed on each side of the molded object 35. These electrodes 37 and 36 are connected electrically to a voltage source 39. A protective resistor 38 is provided in order to limit the current and to guard against any danger of breakdown. It is possible for example to employ a polarization voltage within the range of a few kV to 20 kV and a limiting resistor of $10^7$ to $10^9$ ohms. The sample may or may not be heated during polarization. If it is heated, the heating technique can consist in immersing the sample in an oil having high dielectric strength such as those employed for the insulation of high-voltage transformers.

Average conditions of polarization are as follows:
polarizing electric field: 300 kV/cm to 2 MV/cm,
polarization temperature: 60° to 100° C.,
duration of treatment: from a few seconds to a few tens of minutes.

Figure 7:
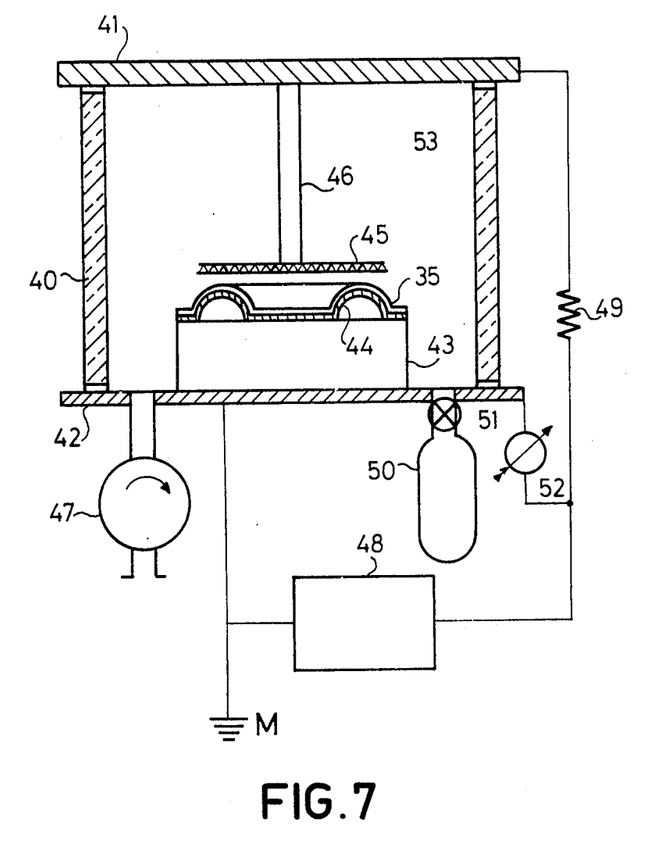
FIG. 7 illustrates an electrical polarization installation.

In FIG. 7, there is shown an installation for electrically polarizing a diaphragm 35 coated with a single electrode 44. This installation comprises a conductive bench 41. A conductive support 43 placed on the bench 42 serves as a seating for the diaphragm 35 and as a ground contact for the electrode 44. A column 46 supports and electrically connects a counter-electrode 45 to the cover 41. An electric generator 48 is connected to ground M and to the cover 41 by means of a protective resistor 49. A voltmeter 52 serves to measure the high voltage produced by the generator 48. Steps can be taken to ensure that the enclosure 53 is at atmospheric pressure, in which case polarization of the diaphragm 35 takes place by means of a corona discharge. It is also possible to reduce the pressure within the enclosure 53 by means of a vacuum pump 47. A neutral gas reservoir 50 fitted with a regulating valve 51 serves to obtain discharge conditions such as to permit formation of a plasma between the electrode 45 and the free surface of the diaphragm 35.

When the polarization operation is completed, a conductive coating is deposited on the top face of the diaphragm 35 in order to form the final transducer element.

By way of constructional example, a loudspeaker has been molded in accordance with the configuration shown in FIG. 6 with an annular flange having an external diameter of 110 millimeters and an internal diameter of 75 millimeters; a flat central portion had a diameter of 25 millimeters and a projecting portion or bulge had a height of 7.5 millimeters. The molding operation was carried out by making use of the copolymer composed of 78% PVF$_2$-22% PTFE.

An electroacoustic transducer of this type has been fabricated with a thickness of 300 microns and polarized at 75° C. with an electric field of 300 kV/cm applied for a period of 15 minutes.

Figure 8:
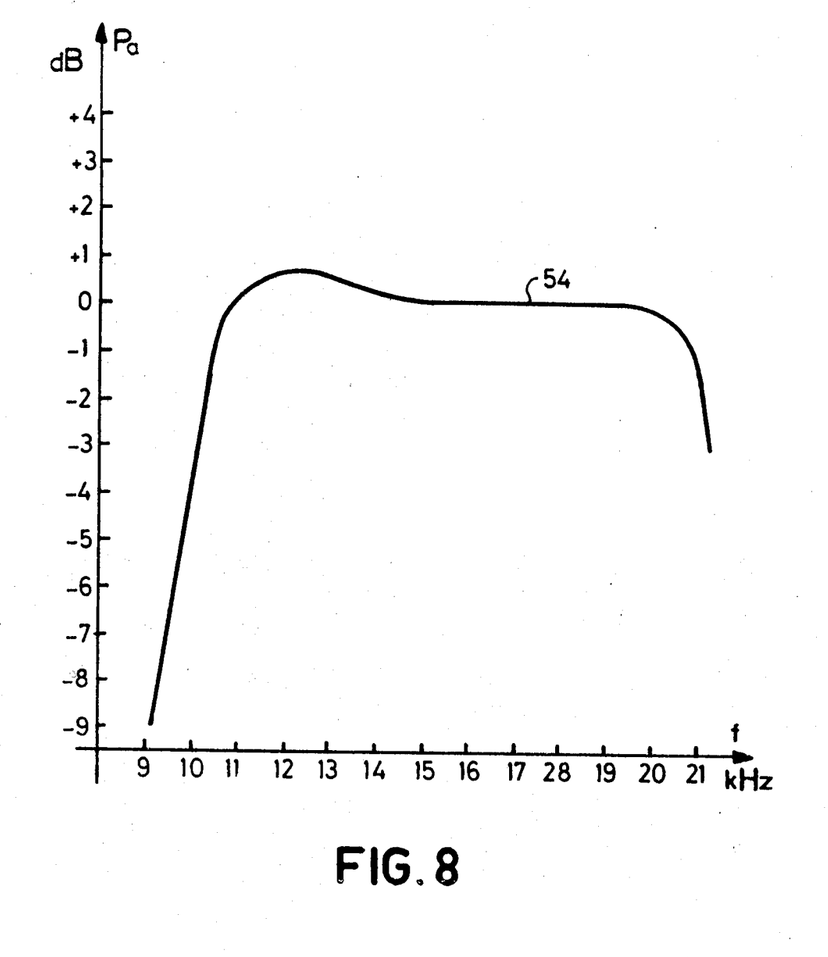
FIG. 8 shows the response curve of the transducer of FIG. 6, this transducer being employed as a loudspeaker.

By applying to this transducer a low-frequency alternating-current voltage of a few tens of volts, there has been obtained a characteristic curve 54 of frequency response at a constant excitation voltage as illustrated in FIG. 8, where $P_a$ designates the acoustic pressure produced and f designates the frequency of the sound radiation emitted.

The invention extends to all fields of application of piezoelectricity and pyroelectricity, in particular to electroacoustic devices, ultrasonic emitters and receivers employed in underwater acoustics, infrared sensors, ink-jet writing devices, devices for firing explosive charges, electric relays and electromechanical filters.

What is claimed is:

1. A method of fabricating the active element of polymer material for a piezoelectric transducer, the principal faces of said active element being in the form of non-developable surfaces and said polymer material building up between said principal faces a self-supporting shell, said method comprising the steps of:
    (1) shaping said polymer material in the form of said shell using shaping means while preserving the mechanical isotropy of said polymer material;
    (2) coating said shell along said principal faces with first and second electrodes facing one another; and thereafter
    (3) applying across said electrodes a polarization voltage for subjecting said polymer material to a poling electric field oriented along the normal to said principal faces thereby endowing said polymer material with piezoelectric properties solely as a result of said poling electric field.

2. A method as claimed in claim 1, wherein said polymer material is composed of polyvinylidene fluoride.

3. A method as claimed in claim 1, wherein said polymer material is a copolymer of polyvinyl fluoride and polytetrafluoroethylene.

4. A method of fabrication according to claim 1, wherein the shaping operation is performed by a mold having two sections into which the material is injected in paste form.

5. A method of fabrication according to claim 1, wherein the shaping operation is performed in a two section mold including introducing the material in the powdered state, the molding operation being performed under pressure at a temperature condition sufficient to initiate melting of the material.

6. A method of fabrication according to claim 1, wherein the shaping operation is performed within a hollow mold by blowing air onto a previously softened preform.

7. A method of fabrication according to claim 1, wherein the shaping operation is performed by coating a hollow mold with a concentrated solution of the polymer material and by subsequently evaporating the solvent.

8. A method of fabrication according to claim 1, wherein the shaping operation is performed by thermoforming the polymer material above its solidification temperature.

* * * * *